US008564344B2

(12) United States Patent
Wen

(10) Patent No.: US 8,564,344 B2
(45) Date of Patent: Oct. 22, 2013

(54) PHASE-LOCKED LOOP CONTROL VOLTAGE DETERMINATION

(75) Inventor: Gan Wen, Beijing (CN)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/882,208

(22) PCT Filed: Dec. 1, 2010

(86) PCT No.: PCT/CN2010/001934
§ 371 (c)(1),
(2), (4) Date: Apr. 29, 2013

(87) PCT Pub. No.: WO2012/071683
PCT Pub. Date: Jun. 7, 2012

(65) Prior Publication Data
US 2013/0214834 A1    Aug. 22, 2013

(51) Int. Cl.
*H03L 7/06*    (2006.01)
(52) U.S. Cl.
USPC .......................................... 327/156; 327/147
(58) Field of Classification Search
USPC ................................................. 327/147, 156
See application file for complete search history.

(56) References Cited

U.S. PATENT DOCUMENTS

| | | | |
|---|---|---|---|
| 5,486,792 A * | 1/1996 | Girardeau, Jr. ................. | 331/10 |
| 5,986,485 A * | 11/1999 | O'Sullivan ..................... | 327/156 |
| 6,084,448 A | 7/2000 | Koszarsky | |
| 6,768,358 B2 * | 7/2004 | Birk et al. ..................... | 327/156 |
| 7,132,897 B2 * | 11/2006 | Hofmann ....................... | 331/16 |
| 7,271,666 B1 | 9/2007 | Melanson | |
| 7,332,973 B2 * | 2/2008 | Lee et al. ...................... | 331/25 |
| 7,508,274 B2 * | 3/2009 | Keating ......................... | 331/16 |

(Continued)

FOREIGN PATENT DOCUMENTS

| | | |
|---|---|---|
| CN | 1377156 A | 10/2002 |
| CN | 1859008 A | 11/2006 |
| CN | 101594144 A | 12/2009 |

OTHER PUBLICATIONS

International Search Report issued for App. No. PCT/CN2010/001934 on Sep. 15, 2011.

(Continued)

*Primary Examiner* — Adam Houston
(74) *Attorney, Agent, or Firm* — Coats and Bennett PLLC

(57) ABSTRACT

A method and circuit is provided for determining a control voltage of a voltage controlled oscillator with fast frequency lock of a phase-locked loop and which is advantageous to the situation when an ultra-low frequency reference is used. The method and circuit determines a current error between a reference clock signal and a feedback clock signal, and checks if the error is larger than the threshold value which checks if an error sign indicator is set, i.e. the error has switched sign since startup of feedback loop; if the error sign indicator is not set, the circuit determines a divisor, $k_n$, using the current error, $e_n$, current control voltage, $u_n$, previous error $e_{n-1}$, and previous control voltage, $u_{n-1}$; however, if the error sign indicator is set the circuit determines a divisor, $k_n$, using stored values for the latest control voltage and error when the error was negative and stored values for the latest control voltage and error when the error was positive; furthermore, the method and circuit determines a control voltage step using the determined error divided by the divisor, $k_n$, and determines a new control voltage using the current control voltage, $u_n$, and the determined control voltage step.

15 Claims, 3 Drawing Sheets

(56) References Cited

U.S. PATENT DOCUMENTS

| | | | |
|---|---|---|---|
| 7,649,421 B2 * | 1/2010 | Victor | 331/16 |
| 7,952,437 B2 * | 5/2011 | Victor | 331/16 |
| 8,344,813 B2 * | 1/2013 | Victor | 331/16 |
| 2003/0231069 A1 | 12/2003 | Chiang et al. | |
| 2009/0262878 A1 * | 10/2009 | Sun et al. | 375/376 |
| 2009/0289674 A1 | 11/2009 | Kao et al. | |
| 2010/0079171 A1 * | 4/2010 | Victor | 327/39 |

OTHER PUBLICATIONS

Abramovitch, D., "Phase-Locked Loops: A Control Centric Tutorial," Proceedings of the American Control Conference, May 8-10, 2002, pp. 1-15, Anchorage, AK.

Gardner, F., "Charge-Pump Phase-Lock Loops," IEEE Transactions on Communications, Nov. 1980, pp. 1849-1858, vol. Com-28, No. 11.

* cited by examiner

PHASE-LOCKED LOOP CONTROL VOLTAGE DETERMINATION

TECHNICAL FIELD

The present invention relates to a method and device for determining a control voltage for a phase-locked loop.

BACKGROUND

In many electrical control systems it is important to synchronize or couple two different signals to each other, for instance this is of interest in radio, telecommunications, and computers where it is of interest to stable frequencies, recover signals, and provide clock timing signals respectively. In these applications it is of interest to provide an output signal whose phase and/or frequency match a reference signal.

In telecommunications technology where different coding schemes are used it is important to synchronize communication data with a decoder in order to extract useful data. One of the components that are part of this synchronization process is a phase-locked loop (PLL) device.

For example, in telecommunication, the Phase-Locked Loop (PLL) is used to generate clocks that have fixed phase/frequency relationship with an input reference clock signal as compared to a feedback clock signal of the PLL. A typical PLL system is a negative control system comparing the feedback clock signal with the reference clock signal; for instance a PLL may comprise a Phase Frequency Detector (PFD), a voltage control oscillator (VCO) providing the feedback clock signal connected in a feedback path to the PFD. The PFD receives the reference and feedback clock signals and detects the frequency and phase error between the input reference clock and the feedback clock. The PLL generates an error signal which will be used to adjust the VCO so that the phase/frequency of the output/feedback clock will be the same or within a suitable range as the reference clock, which is said to then lock to the reference clock, i.e. the error between the feedback and reference clocks are substantially zero. The PLL may be locked in a first iteration or it may require a number of iterations before the feedback clock signal is suitably close to the reference signal in order to be determined as locked. The phase is the derivative of the frequency meaning there is a direct relationship between the two.

A phase-locked loop solution based on a charge-pump is for instance described in "Charge-Pump Phase-Lock Loops" in IEEE Transactions on Communications, vol. corn-28, no. 11, November 1980 and a general description of phase-locked loops may be found in "Phase-Locked Loops: A Control Centric Tutorial" from the Proceedings of the 2002 ACC. These may provide a basic understanding of PLL circuits and their applications.

Given a constant loop gain, the PLL lock time is related to the frequency of the reference clock. For typical PLLs, the lower the frequency of the reference clock is, the slower the convergence speed will be. Hence a typical PLL is not efficient for ultra-low frequency clocks, for example, 1 pulse per second signal (1 PPS signal), i.e. it will take long time before the output/feedback clock lock to the reference clock.

SUMMARY

It is therefore an object to provide a fast converging Phase-Lock Loop (PLL) which may be used with an ultra-low frequency clock. This is provided in a number of aspects, in which a first is a method for determining control voltage in a phase-locked loop device comprising a feedback clock. The method comprises determining a current error between a reference clock signal and a feedback clock signal. The method further comprises checking if the determined error is larger than the threshold value. If the determined error is larger than the threshold value the method further comprise: checking an error sign indicator which indicates if the error has switched sign some time since startup of the feedback process.

If it is the first time that the current error switches sign from previous error, an error sign indicator, e.g. a cross flag (flag CF) will be set. And the flag CF will keep its value until stop of the feedback process.

If it is determined that the error sign indicator is not set, a divisor, $k_n$, is determined using the current error, $e_n$, current control voltage, $u_n$, previous error, $e_{n-1}$, and previous control voltage, $u_{n-1}$.

However, if it is determined that the error sign indicator is set, the divisor, $k_n$, is determined using stored values for a latest control voltage and latest determined error when the sign of the error was negative and using stored values for a latest control voltage and latest determined error when the sign of the error was positive.

Furthermore, the method comprise determining a control voltage step using the determined error divided by the divisor, $k_n$, and determining a new control voltage, $u_{n+1}$, using the current control voltage, $u_n$, and the determined control voltage step.

Another aspect of the present invention is provided, a phase locked loop circuit (PLL). The PLL comprise a frequency detector (FD) receiving a reference clock signal and a feedback clock signal. The PFD is arranged to output an error signal relative to the frequency difference between the reference clock and feedback clock signals. The PLL further comprises a control voltage calculator receiving the error signal and in turn outputting a control voltage to a voltage controlled oscillator (VCO). The VCO in turn is arranged to generate a feedback signal to the frequency detector and an output clock signal used in any application, e.g. a decoder circuit, connected to the PLL. The control voltage calculator is arranged to determine a current error between the reference clock signal and a feedback clock signal, and check if the determined current error is larger than a threshold value. If the determined current error is larger than the threshold value, the control voltage calculator checks if an error sign indicator is set. If the error sign indicator is not set, the control voltage calculator determines a divisor, $k_n$, using the current error, $e_n$, current control voltage, $u_n$, previous error, $e_{n-1}$, and previous control voltage, $u_{n-1}$, If the error sign indicator is set, the control voltage calculator determines a divisor, $k_n$, using the latest control voltage $U_L$ and corresponding error $E_L$ when error sign is negative and the latest control voltage $U_R$ and corresponding error $E_R$ when error sign is positive. Furthermore, the control voltage calculator is arranged to determine a control voltage step using the determined error divided by the divisor, $k_n$, and determine a new control voltage using the current control voltage, $u_n$, and the determined control voltage step.

The circuit may further comprise a control voltage converter used for converting the control voltage from the control voltage calculator to an analogue electrical signal controlling the voltage controlled oscillator.

The above aspects are advantageously used when the error is relatively linear to the control voltage and when the reference signal is an ultra low frequency signal, since the method and circuit provide an improved convergence of the feedback clock signal to the reference clock signal.

BRIEF DESCRIPTION OF THE DRAWINGS

In the following the invention will be described in a non-limiting way and in more detail with reference to exemplary embodiments illustrated in the enclosed drawings, in which.

DETAILED DESCRIPTION

Figure 1:
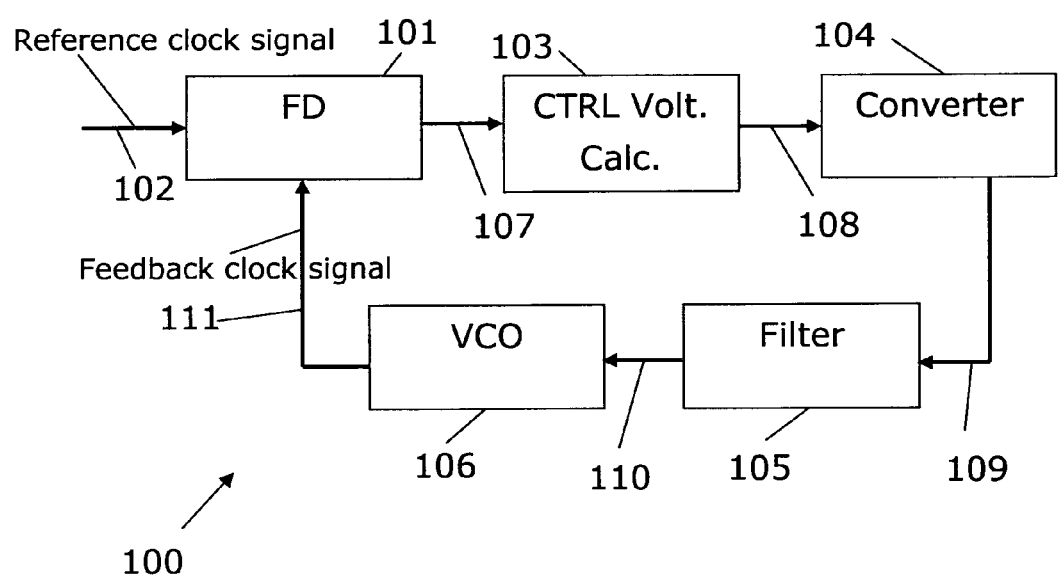
FIG. 1 illustrates schematically a device according to the present invention.

In FIG. 1 reference numeral 100 generally denotes a Phase Locked-Loop (PLL) circuit according to the present invention. The PLL comprises a frequency detector (FD) 101 receiving a reference clock signal 102 and receiving a feedback clock signal 111. The frequency detector outputs 107 error signals to a control voltage calculator 103 (CTRL Volt. Calc.) in turn connected 108 to a digital to analog converter 104. The converter 104 may in turn be connected 109 to a loop filter 105 which may be provided between the converter 104 and a voltage controlled oscillator 106 (VCO). The VCO may for instance be a voltage controlled crystal oscillator or an LC-type oscillator. The VCO in turn is connected to the frequency detector and outputs a feedback clock signal 111 to the FD 101 and the loop is formed as indicated in FIG. 1. It should be noted that the loop filter 105 may be located between the control voltage calculator and the converter. It should also be noted that the converter 104 may be optional in some circumstances. It should also be noted that frequency detector 101 may be a phase frequency detector. The reference clock signal may be of any frequency including but not limited to ultra-low frequency signals.

The frequency detector is arranged to detect the frequency difference between the reference clock signal and the VCO generated feedback clock signal. As will be exemplified in detail below, the frequency is sampled both from the reference clock signal and the feedback clock signal. The control voltage calculator determines the error between the two frequencies and determines a control voltage level for controlling the VCO in order to change the frequency or phase of the output from the VCO generating the feedback clock signal to better follow the reference clock signal. The control voltage calculator operates preferably in the digital domain and the VCO in the analogue domain which means that the control voltage convertor converts the digital control voltage signal to an analogue signal. Furthermore, the loop filter may be a low pass filter or gain filter which may be used for determining the time characteristics of the PLL circuit, provide stability by removing spurious signals, such as ripple, and so on. The VCO outputs a feedback signal of known amplitude and form with a frequency determined by the control voltage. This feedback signal is used both by the frequency detector and in an application, e.g. a communications signal decoder (not shown). The process operates iteratively and continuously.

When the frequency error is relatively linear to the control voltage, it is possible to calculate quickly the final control voltage, under which the error is substantially zero. Using a binary search type algorithm the control voltage is determined quickly to a final control voltage. In each iteration of the calculations, the gain between the control voltage and the error will be calculated, and based on the calculated gain a next estimated control voltage with substantially zero error will be calculated.

A theoretical foundation of the principles of using a linear relationship between the control voltage and the error between the reference clock signal and feedback clock signal may be shown as follows: a typical function of the VCO signal, e.g. frequency, vs. control voltage is a monotone increasing function, and substantially linearly oriented. The linear behavior may be depicted as $$f = k(u - u_c) + f_c$$

Where $f_c$ is a nominal frequency, $u_c$ is control voltage corresponding to the nominal frequency, f is the frequency at a certain control voltage u, and k a constant. Suppose the reference clock frequency is $f_r$, the frequency error $\Delta f$ between the reference clock and the feedback clock signals is:

$$\Delta f = k(u - u_c) + f_c - f_r$$

Ideally, the frequency error is linear to the control voltage. In this solution it is advantageous that the frequency detector detects the frequency error, e, i.e. the difference between the reference and feedback clock signals, with a certain gain, $k_f$, as:

$$e = k_f \Delta f$$

Exemplifying a calculation for determining the control voltage where the frequency difference between the reference and feedback clock signals are used: suppose after the initialization of the system the control voltage of the VCO stays at $u_0$, and the corresponding frequency error $e_0 < 0$, i.e. the frequency of the reference clock is larger than the frequency of the loopback clock. The system is then to choose a certain voltage step d>0 (or d<0 if $e_0$>0) to change the current voltage setting, i.e. let the new voltage be set by adding the voltage step to the current voltage: $u_1 = u_0 + d$. At the same time a "cross flag" is set to indicate if the control voltage has become large enough to make the frequency error larger than zero, i.e. the frequency of the reference clock is smaller than the frequency of the feedback clock. Below the following parameters will be used in calculating a new control voltage:

$e_n$ is a current frequency error
$u_n$ is a current control voltage
$e_{n-1}$ is a previous frequency error
$u_{n-1}$ is a previous control voltage
$U_L$ is a latest control voltage when the error was negative;
$U_R$ is a latest control voltage when the error was positive;
$E_L$ is a latest frequency error when the error was negative;
$E_R$ is a latest frequency error when the error was positive; and
CF or cross flag is an error sign indicator for indicating if the error has switched sign, i.e. moved from positive to negative or vice versa as compared to the starting situation when the feedback loop was started.

With previous is meant the value determined closest in time before the current value of error and control voltage, i.e. sampled in an iteration immediately preceding the current iteration of calculations.

Then for any given step n>0,
if the frequency error $e_n < 0$ and $|e_n|$ is smaller than, or the same as (depending on configuration), a pre-defined threshold value, the frequency of the feedback signal need not be changed and thus the control voltage need not be changed but is kept at its current value for this iteration, i.e. $u_{n+1} = u_n$. Otherwise, if the frequency error is smaller than zero, i.e. $e_n < 0$, and $|e_n|$ is larger than, or the same as (depending on configuration), the pre-defined threshold value and if CF=0: the following parameters are set $$U_L = u_n$$

$$E_L = e_n$$

and the following are calculated $$k_n = \frac{e_n - e_{n-1}}{u_n - u_{n-1}} \quad \text{(ALG 1)}$$

$$u_{n+1} = u_n - \frac{e_n}{k_n}$$

else if $CF = 1$ the following parameters are set $$U_L = u_n$$

$$E_L = e_n$$

and the following are calculated $$k_n = \frac{E_R - E_L}{U_R - U_L} \quad \text{(ALG 2)}$$

$$u_{n+1} = u_n - \frac{e_n}{k_n}$$

If $e_n > 0$, and $e_n$ is smaller than a pre-defined threshold value, the frequency of the feedback signal need no be changed and thus the control voltage is kept at its current value for this iteration, i.e. $u_{n+1} = u_n$. However, if $e_n > 0$ and $e_n$ is larger than the pre-defined threshold value, let the following parameters be set as $$CF = 1$$

$$U_R = u_n$$

$$E_R = e_n$$

and the following parameters calculated $$k_n = \frac{E_R - E_L}{U_R - U_L}$$

$$u_{n+1} = u_n - \frac{e_n}{k_n}$$

The new control voltage $u_{n+1}$ is outputted from the control voltage calculator to the VCO via the converter and loop filter depending on configuration of the PLL.

The above described calculations are preferably done in a digital signal domain, and since the control voltage is also represented as digital number from the control voltage calculator, a control voltage converter is needed to convert the digital control voltage to an analog control voltage for controlling the VCO. For example, the converter may be a digital to analogue converter, DAC.

Figure 2:
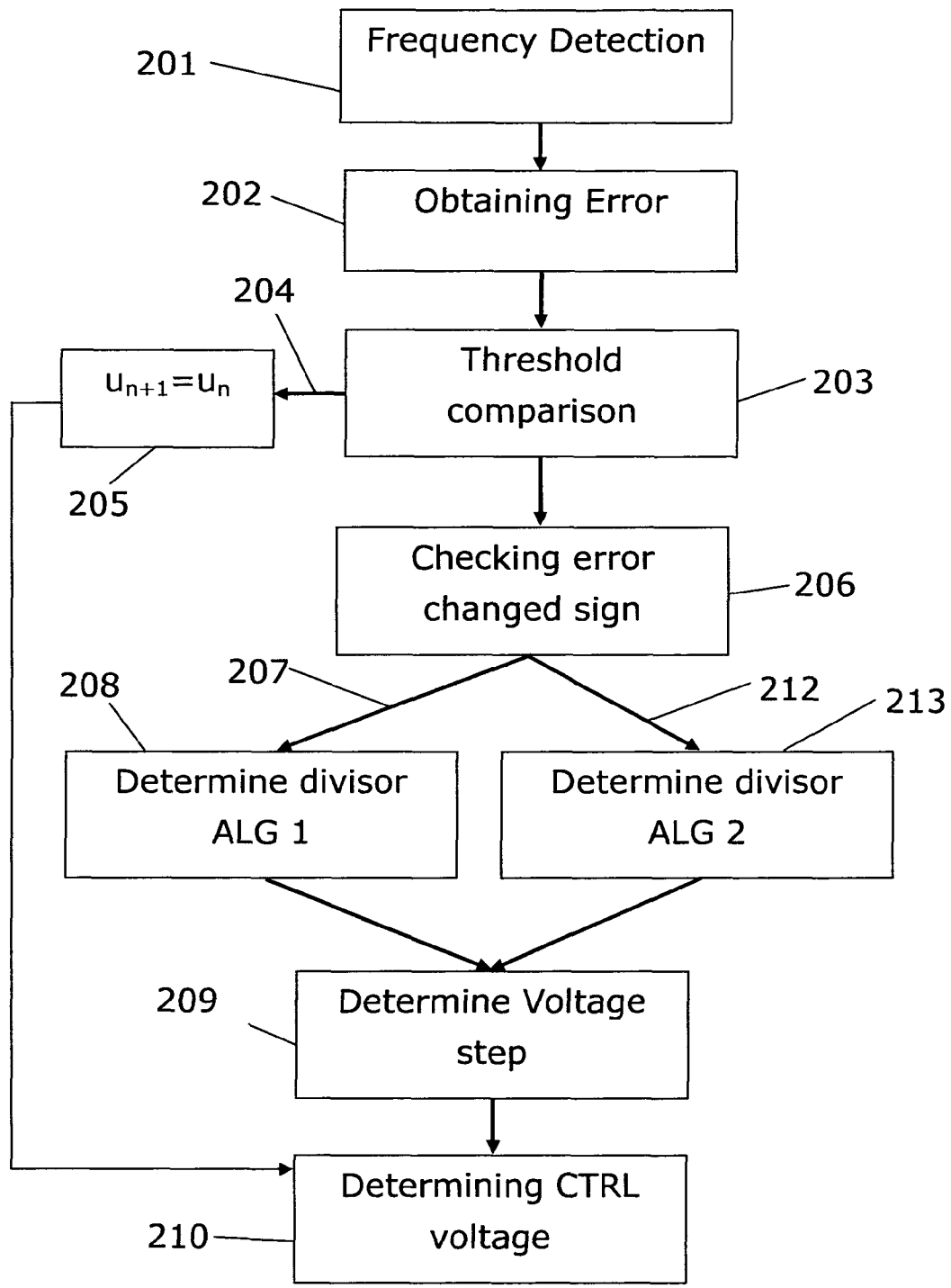
FIG. 2 illustrates schematically a method according to the present invention.

The calculations are executed in a method operated by the PLL. The method may be illustrated as in FIG. 2 schematically indicating steps of operation. The frequencies of the reference clock and feedback clock signals are detected 201 or provided to the control voltage calculator for determination of error between the frequencies. The frequencies of the reference and feedback clock signals are used for determining 202 the difference/error between the signals and the frequency error is compared 203 to determine if the error is below a predefined threshold value or not: if the error is below or the same as (depending on configuration) the threshold value, then no adjustment of the control voltage is necessary 205; however, if the error is larger than the threshold value a new control voltage is to be determined. It should be noted that the current error may be sampled as an average of several error measurements.

The control voltage calculator determines if the frequency of the feedback clock signal is larger or smaller than the reference clock signal and this may be compared 206 with a previous result to see if the error has changed sign, i.e. it is compared to a stored value indicating a determination of the error performed immediately before the current determination of the error. Depending 207, 212 on the outcome of this sign comparison different methods may be used for determining a new control voltage. The two different routes 208, 213 are similar but use different parameters in the calculation of the divisor, $k_n$, to determine the actual control voltage as indicated above. When the divisor is determined, a voltage step may be determined 209 and finally a new control voltage may be determined 210.

More generally this may be summarized in tables 1 and 2 describing two different starting positions, where the first row indicate the current configuration after determining the current error, the second, third and fourth illustrate that a number of parameters are set accordingly as discussed above, and the fifth and sixth rows are calculations to be performed in order to determine a new control voltage.

During initialization the following parameters are set $U_L = E_L = U_R = E_R = 0$, $CF = 0$ In table 1 it is assumed that to start with the frequency error e is smaller than zero, i.e. $e < 0$, before determining the current error, and to choose a suitable step $d > 0$, let $u_1 = u_0 + d$, then for $n > 1$ a new control voltage may be calculated as below:

TABLE 1

| Current configuration | $e_n < 0$, $|e_n| <$ threshold | $e_n < 0$, $|e_n| >$ threshold $CF = 0$ | $e_n < 0$, $|e_n| >$ threshold $CF = 1$ | $e_n > 0$, $|e_n| <$ threshold | $e_n > 0$, $|e_n| >$ threshold |
|---|---|---|---|---|---|
| Set | | $CF = CF$ | $CF = CF$ | | $CF = 1$ |
| Set | | $U_L = u_n$ | $U_L = u_n$ | | $U_R = u_n$ |
| Set | | $E_L = e_n$ | $E_L = e_n$ | | $E_R = e_n$ |
| Calculate | | $k_n = \frac{e_n - e_{n-1}}{u_n - u_{n-1}}$ | $k_n = \frac{E_R - E_L}{U_R - U_L}$ | | $k_n = \frac{E_R - E_L}{U_R - U_L}$ |
| Calculate | $u_{n+1} = u_n$ | $u_{n+1} = u_n - \frac{e_n}{k_n}$ | $u_{n+1} = u_n - \frac{e_n}{k_n}$ | $u_{n+1} = u_n$ | $u_{n+1} = u_n - \frac{e_n}{k_n}$ |

However, as is indicated in Table 2, if the initial frequency error e is larger than zero, i.e. $e > 0$, before determining the current error, and the method is to choose a suitable step $d < 0$, let $u_1 = u_0 + d$, for $n > 1$ a new control voltage may be calculated as follows:

TABLE 2

| Current configuration | $e_n < 0$, $\|e_n\| <$ threshold | $e_n > 0$, $\|e_n\| >$ threshold CF = 0 | $e_n > 0$, $\|e_n\| >$ threshold CF = 1 | $e_n > 0$, $\|e_n\| <$ threshold | $e_n < 0$, $\|e_n\| >$ threshold |
|---|---|---|---|---|---|
| Set | | CF = CF | CF = CF | | CF = 1 |
| Set | | $U_R = u_n$ | $U_R = u_n$ | | $U_L = u_n$ |
| Set | | $E_R = e_n$ | $E_R = e_n$ | | $E_L = e_n$ |
| Calculate | | $k_n = \dfrac{e_n - e_{n-1}}{u_n - u_{n-1}}$ | $k_n = \dfrac{E_R - E_L}{U_R - U_L}$ | | $k_n = \dfrac{E_R - E_L}{U_R - U_L}$ |
| Calculate | $u_{n+1} = u_n$ | $u_{n+1} = u_n - \dfrac{e_n}{k_n}$ | $u_{n+1} = u_n - \dfrac{e_n}{k_n}$ | $u_{n+1} = u_n$ | $u_{n+1} = u_n - \dfrac{e_n}{k_n}$ |

The method has a fast convergence characteristic. Since the FD quantize the frequency error, the accuracy of the adjustment greatly depends on the quantization error introduced by the PFD. Hence, this method may in some configurations where the quantization error is above some level be utilized as a coarse frequency adjustment of the PLL and to achieve better quality of the clock (for example, lower jitter, and lower phase noise etc.), a fine frequency adjustment may be utilized after the coarse adjustment.

Figure 3:
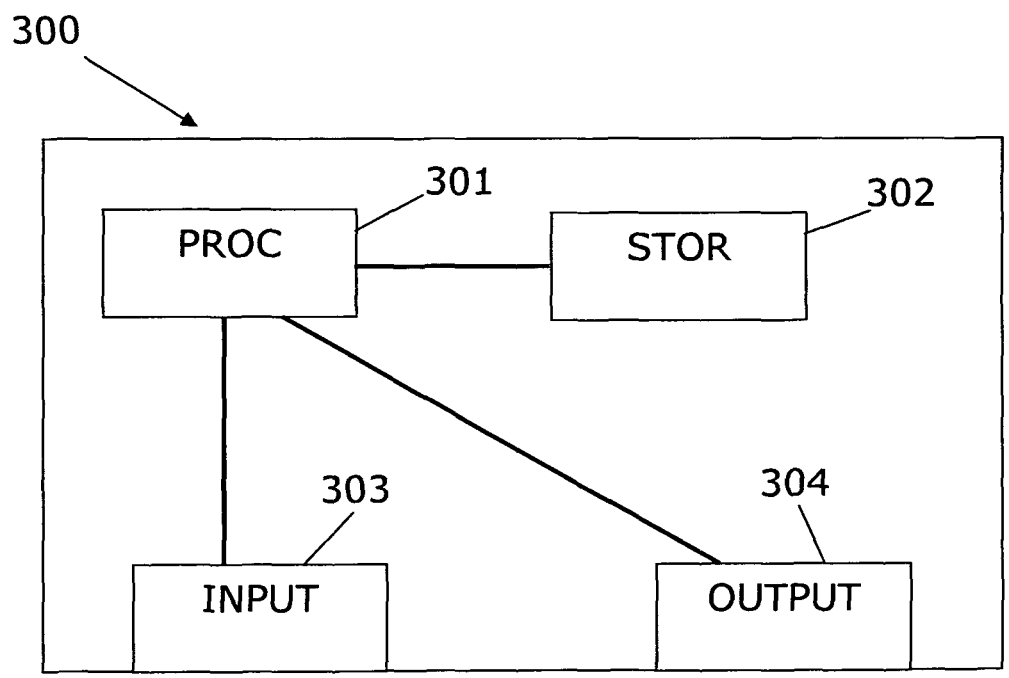
FIG. 3 illustrates schematically a device according to the present invention.

One embodiment of the Control Voltage Calculator 300 is illustrated in FIG. 3 and comprises at least one processing unit 301, at least one computer readable storage unit 302, at least one input unit 303, and at least one output unit 304. The processing unit is arranged to execute the operation of the Control Voltage Calculator, e.g. in software or hardware instruction sets. The processing unit may, for instance, comprise a microprocessor, a digital signal processor (DSP), or application specific integrated circuit (ASIC). Furthermore, the storage unit may comprise a non-volatile memory and/or a volatile memory used by the processing unit for storing instruction sets and/or intermediate data during calculations and between iterations. The input unit 303 is configured to receive an error signal from the PFD and a control voltage signal is output through the output unit 304. Other embodiments of the Control Voltage Calculator may comprise gate logic circuits for instance in a gate array or in discrete components, e.g. with AND/NAND components.

The method and circuit according to the present invention provides a fast convergence and thus is arranged to receive an ultra-low frequency reference signal and still provide a locked PLL within an acceptable time.

It should be noted that the word "comprising" does not exclude the presence of other elements or steps than those listed and the words "a" or "an" preceding an element do not exclude the presence of a plurality of such elements. It should further be noted that any reference signs do not limit the scope of the claims, that the invention may be at least in part implemented by means of both hardware and/or software, and that several "means" or "units" may be represented by the same item of hardware.

The above mentioned and described embodiments are only given as examples and should not be limiting to the present invention. Other solutions, uses, objectives, and functions within the scope of the invention as claimed in the below described patent claims should be apparent for the person skilled in the art.

ABBREVIATIONS

PLL Phase-locked loop
FD Frequency detector
DAC Digital to analog converter
VCO Voltage controlled oscillator

The invention claimed is:

1. A method for determining a control voltage in a phase-locked loop circuit comprising a feedback clock, the method comprising:
   obtaining a current error $e_n$ between a reference clock signal and a feedback clock signal;
   determining if the current error is larger than a threshold value, and if so:
   determine a divisor $k_n$ based on an error sign indicator such that:
      if the error sign indicator indicates that error has not changed sign, the divisor $k_n$ is determined using the current error $e_n$, a current control voltage $u_n$, a previous error $e_{n-1}$, and a previous control voltage $u_{n-1}$;
      if the error sign indicator indicates that the error has changed sign, the divisor $k_n$ is determined using:
         stored values for a latest control voltage and a latest determined error when the sign of the error was negative;
         stored values for a latest control voltage and a latest determined error when the sign of the error was positive;
   determining a control voltage step using the current error divided by the divisor $k_n$; and
   determining a new control voltage $u_{n+1}$ using the current control voltage $u_n$ and the determined control voltage step.

2. The method of claim 1, wherein determining the divisor $k_n$ when the error sign indicator indicates an error sign change comprises forming a the divisor $k_n$, using a numerator comprising a latest error $E_R$ when the sign of the error was positive subtracted by a latest determined error $E_L$ when the sign of the error was negative, and using a dividend comprising a latest control voltage $U_R$ when the sign of the error was positive subtracted by latest determined control voltage $U_L$ when the sign of the error was negative.

3. The method of claim 1, further comprising setting an error sign indicator to indicate that the error has changed sign if the current error has changed sign.

4. The method of claim 3, wherein determining the divisor $k_n$ when the error sign indicator indicates an error sign change comprises forming a the divisor $k_n$, using a numerator comprising a latest error $E_R$ when the sign of the error was positive subtracted by a latest determined error $E_L$ when the sign of the error was negative, and using a dividend comprising a latest control voltage $U_R$ when the sign of the error was positive subtracted by latest determined control voltage $U_L$ when the sign of the error was negative.

5. The method of claim 1, further comprising, setting, in response to the current error being below a threshold value, the control voltage to the previous control voltage.

6. The method of claim 5, wherein determining the divisor $k_n$ when the error sign indicator indicates an error sign change comprises forming a the divisor $k_n$, using a numerator comprising a latest error $E_R$ when the sign of the error was positive subtracted by a latest determined error $E_L$ when the sign of the error was negative, and using a dividend comprising a latest control voltage $U_R$ when the sign of the error was positive subtracted by latest determined control voltage $U_L$ when the sign of the error was negative.

7. The method of claim 1:
    further comprising storing registers with information related to the previous error;
    wherein the information comprises:
        a latest error $E_R$ when the error was positive;
        a latest frequency error $E_L$ when the error was negative;
        a latest control voltage $U_R$ when the error was positive;
        a latest control voltage $U_L$ when the error was negative;
        the previous error $e_{n-1}$; and
        the previous control voltage $u_{n-1}$.

8. The method of claim 7, wherein determining the divisor $k_n$ when the error sign indicator indicates an error sign change comprises forming a the divisor $k_n$, using a numerator comprising $E_R$ subtracted by $E_L$, and using a dividend comprising $U_R$ subtracted by $U_L$.

9. The method of claim 1 wherein determining the divisor $k_n$ when the error sign indicator does not indicate any error sign change comprises forming the divisor $k_n$ using a numerator comprising the current error $e_n$ subtracted by the previous error $e_{n-1}$, and using a denominator comprising the current control voltage $u_n$ subtracted by the previous control voltage $u_{n-1}$.

10. The method of claim 1, wherein determining the new control voltage $u_{n+1}$ comprises subtracting, from the current control voltage $u_n$, the determined control voltage step formed by the current error $e_n$ divided by the divisor $k_n$.

11. The method of claim 1, wherein the method is performed in a digital signal domain.

12. A phase locked loop (PLL) circuit comprising:
    a frequency detector configured to:
        receive a reference clock signal and a feedback clock signal; and
        output an error signal related to a difference of frequency between the reference and feedback clock signals;
    a voltage controlled oscillator;
    a control voltage calculator configured to:
        receive the error signal; and
        output a control voltage signal to the voltage controlled oscillator
    wherein the voltage controlled oscillator is configured to generate a feedback signal to the frequency detector based on the control voltage signal;
    wherein the control voltage calculator is arranged to:
        obtain a current error $e_n$ between the reference clock signal and the feedback clock signal;
        determine if the current error is larger than a threshold value, and if so:
            determine a divisor $k_n$ based on an error sign indicator such that:
                if the error sign indicator indicates that error has not changed sign, the divisor $k_n$ is determined using the current error $e_n$, a current control voltage $u_n$, a previous error $e_{n-1}$, and a previous control voltage $u_{n-1}$;
                if the error sign indicator indicates that the error has changed sign, the divisor $k_n$ is determined using:
                    stored values for a latest control voltage and a latest determined error when the sign of the error was negative;
                    stored values for a latest control voltage and a latest determined error when the sign of the error was positive;
            determine a control voltage step using the current error divided by the divisor $k_n$; and
            determine a new control voltage $u_{n+1}$ using the current control voltage $u_n$ and the determined control voltage step.

13. The PLL circuit of claim 12, further comprising a control voltage converter configured to convert the control voltage from the control voltage calculator to an analog electrical signal controlling the voltage controlled oscillator.

14. The PLL circuit of claim 13, further comprising a filter operatively disposed between the control voltage converter and the voltage controlled oscillator.

15. The PLL circuit of claim 12, wherein the PLL circuit is configured to receive an ultra-low frequency reference clock.

* * * * *

UNITED STATES PATENT AND TRADEMARK OFFICE
CERTIFICATE OF CORRECTION

| | | |
|---|---|---|
| PATENT NO. | : 8,564,344 B2 | Page 1 of 1 |
| APPLICATION NO. | : 13/882208 | |
| DATED | : October 22, 2013 | |
| INVENTOR(S) | : Wen | |

It is certified that error appears in the above-identified patent and that said Letters Patent is hereby corrected as shown below:

In the Specification

In Column 1, Line 48, delete "corn-28," and insert -- com-28, --, therefor.

In the Claims

In Column 8, Line 49, in Claim 2, delete "forming a the" and insert -- forming the --, therefor.

In Column 8, Line 61, in Claim 4, delete "forming a the" and insert -- forming the --, therefor.

In Column 9, Line 6, in Claim 6, delete "forming a the" and insert -- forming the --, therefor.

In Column 9, Line 26, in Claim 8, delete "forming a the" and insert -- forming the --, therefor.

Signed and Sealed this
Eleventh Day of February, 2014

Michelle K. Lee
*Deputy Director of the United States Patent and Trademark Office*